United States Patent [19]

Tsubokura

[11] Patent Number: 4,631,571
[45] Date of Patent: Dec. 23, 1986

[54] SEMICONDUCTOR DEVICE FOR USE IN A LARGE SCALE INTEGRATION CIRCUIT
[75] Inventor: Fusao Tsubokura, Tokyo, Japan
[73] Assignee: NEC Corporation, Tokyo, Japan
[21] Appl. No.: 589,371
[22] Filed: Mar. 14, 1984
[30] Foreign Application Priority Data
Mar. 14, 1983 [JP] Japan .................. 58-41673
[51] Int. Cl.[4] ............... H01L 23/48; H01L 29/44; H01L 29/78; H01L 27/10
[52] U.S. Cl. ........................ 357/68; 357/65; 357/23.1; 357/45; 357/71
[58] Field of Search ............ 357/65, 68, 71, 46, 357/36, 45, 27, 23.1

[56] References Cited

U.S. PATENT DOCUMENTS

| | | | |
|---|---|---|---|
| 3,652,906 | 3/1972 | Christensen | 357/46 |
| 3,878,550 | 4/1975 | Benjamin | 357/68 |
| 4,499,484 | 2/1985 | Tanizawa et al. | 357/45 |
| 4,511,914 | 4/1985 | Remedi et al. | 357/68 |
| 4,568,961 | 2/1986 | Noto | 357/68 |

FOREIGN PATENT DOCUMENTS

| | | | |
|---|---|---|---|
| 1527430 | 3/1968 | France | 357/36 |
| 36470 | 3/1977 | Japan | 357/68 |

Primary Examiner—Andrew J. James
Assistant Examiner—R. P. Limanek
Attorney, Agent, or Firm—Sughrue, Mion, Zinn, Macpeak, and Seas

[57] ABSTRACT

An output signal is derived from an output buffer to an external lead in a semiconductor device. In general, the output buffer is constructed using an MOS transistor and is located near a bonding pad on the chip. Therefore, the number of bonding pads which can be formed on the chip is limited by the output buffer space. The present invention provides the output buffer with a tapered or tiered shape which reduces the pitch between bonding pads. Thus, a large number of bonding pads (output buffers) can be integrated in a semiconductor chip according to the present invention.

10 Claims, 7 Drawing Figures

SEMICONDUCTOR DEVICE FOR USE IN A LARGE SCALE INTEGRATION CIRCUIT

BACKGROUND OF THE INVENTION

1. Field of the Invention

The invention relates to a semiconductor device for use in a large scale integration circuit (IC), and more particularly to a semiconductor device having insulated gate field effect transistors (IGFETS) such as metal-oxide-semiconductor field effect transistors (MOSFETS) and complementary MOSFETS 2. Description of the Prior Art Using metal-oxide semiconductor (MOS) IC technology, a large number of field effect transistors (FETS), may have been integrated in a semiconductor chip. As a result, many input and output terminals are required to connect the internal circuits of the semiconductor chip to external devices. It is clear that the number of these terminals is in proportion to the quantity of information which is to be processed in the device. Therefore, a large number of terminals will be required in a large scale integration circuit device. Each terminal is connected to a bonding pad on a semiconductor chip, respectively. The bonding pad in turn is connected to an interface element (for example, a buffer element) which is also on the chip. The interface element has, in general, a terminal (i.e. a bonding pad or the like) and an input and/or output buffer circuit. The terminal is connected to one end portion of the input and/or output buffer transistor, while the other end of the input and/or output buffer transistor is connected to an internal processing circuit such as a register circuit or a latch circuit. Since this interface element is associated with each terminal, an increase in the number of terminals increases the chip size. However, increasing the chip size is undesirable because it decreases the production yield rate while increasing cost. Particularly, when the buffer element is formed using complementary MOS (CMOS) technology, a P-channel MOS transistor and an N-channel MOS transistor are used as a buffer circuit and are respectively positioned at both sides of a bonding pad. Therefore, increasing the number of terminals (or input-/output bits) is a significant problem in CMOS IC devices.

An object of the present invention is to provide a semiconductor device in which the size of a buffer element is reduced.

Another object of the present invention is to provide an MOS IC device in integrated circuit form having many input/output buffer elements, each of which has a bonding pad and an input/output buffer circuit.

SUMMARY OF THE INVENTION

A semiconductor device according to the present invention has at least one output buffer circuit whose one end portion is connected to a bonding pad or the like and the other end portion is connected to an internal processing circuit on a semiconductor chip. The output buffer circuit receives an output signal at the other end portion from the internal circuit and derives it from the one end portion to the bonding pad. The one end portion has a first contact area to which a first conductive path (for example, a conductive layer, a conductive film, etc.) connects the output buffer and the bonding pad. The other end portion has a second contact area to which a second conductive path connects the output buffer circuit and the internal circuit. The one end portion is positioned on the side of the bonding pad and at a peripheral portion of the semiconductor chip. On the other hand, the other end portion is positioned inwardly within the chip. That is, the output buffer circuit extends from a peripheral portion of the chip toward an internal portion, and is particularly fromed such that a width of the one end portion is less than the width of the other end portion. It is preferred that the other end has the widest portion and the one end has the narrowest portion. Therefore, the output buffer circuit is formed such that its width becomes successively more narrow from the other end toward the one end. Particularly, a plan view pattern of the output buffer circuit may be arranged in a taper shape, a tiered shape, or the like. However, the taper or tiers of the output buffer circuit is formed on the side which is adjacent to the bonding pad. The other side opposite to the one side with the taper or the tiers should be varied as little as possible. The one end portion of the output buffer circuit is positioned proximate to the bonding pad. Thus, a distance from the bonding pad to the other side of the output buffer circuit will be reduced in the present invention in contrast with that of the prior art. According to the present invention, the size of a buffer element can be reduced, and therefore, a greater number of bonding pads than could be achieved using prior art teachings can be integrated on a semiconductor chip without increasing the chip size.

This effect of the present invention is obtained by development which is newly recognized by the inventor as follows:

In general, the size of an output buffer transistor is determined by a drive current which is to be applied thereto. Particularly, the size of an electrode of the output buffer transistor is determined in accordance with the drive current. For example, in the case where the output buffer transistor provides an MOS FET with 10 mA as the drive current, 18 to 20 mm × 400 mm are required to implement the source electrode and a drain electrode, respectively. In particular, since the source electrode is commonly used by two adjacent FETS, the size of it becomes larger than the above. In this case 25 to 27 mm × 400 mm are required to implement the electrodes in practical used. On the other hand, a distance from an edge of the bonding pad to an edge of a drain diffusion area is to be determined by a bonding stress. Generally, 10 mm is required for this distance to prevent bonding stress from affecting the drain diffusion layer. Therefore, in the prior art the output buffer MOSFET is positioned in parallel with the bonding pad as described hereinbefore, in which the drain electrode size is 18 mm × 400 mm, and the source electrode size is 25 mm × 400 mm. In this case, the distance between an edge of the bonding pad and an end of the source diffusion layer is about 60 mm.

However, the inventor found that the area receiving an effect of the drive current is not the entire region of the FET but the partial region to which an output signal from the internal circuit is fastly applied, that is, the other end portion described above. With respect to the one end portion positioned near the bonding pad, the drive current does not depend on electrode size. Therefore, the output buffer need not be formed with the same size from the one end portion to the other end portion. This difference in size is very conspicuous at the source area of the FET. While, the drain and the gate areas preferably are formed of substantially the same size from the one end to the other end.

In view of the above recognition, the size of the source electrode of the one end portion which is near the bonding pad may be smaller than that of the other end portion which is far from the pad. With respect to the size of the source diffusion area in the one end portion, an area on which the source electrode is formed, that is, a small diffusion area only is required, since the rate of contribution to the output drive current is small. However, the size of source diffusion area in the other end portion must be large in proportion to the source electrode positioned on this portion. In addition, the shape of a contact area attached to the source electrode may be also varied in accordance with the shape of the source electrode.

According to the preferred pattern of an output buffer transistor, a source diffusion area and a source electrode have such shapes that their sizes become gradually large from a peripheral portion of a semiconductor chip toward an internal portion. A channel area, a gate electrode, a drain diffusion area and a drain electrode are formed along the source electrode, respectively, but are not changed in the respective size. A bonding pad is positioned near the small portion of the source electrode via the gate and the drain electrodes. Consequently, the distance from the bonding pad to the source electrode becomes small, so that the size of an output buffer element can be reduced without reductions of an output drive capacity and electric characteristics of the element. According to the present invention, a large number of buffer elements can be integrated in a semiconductor chip.

DETAILED DESCRIPTION OF THE PREFERRED EMBODIMENTS

Figure 1:
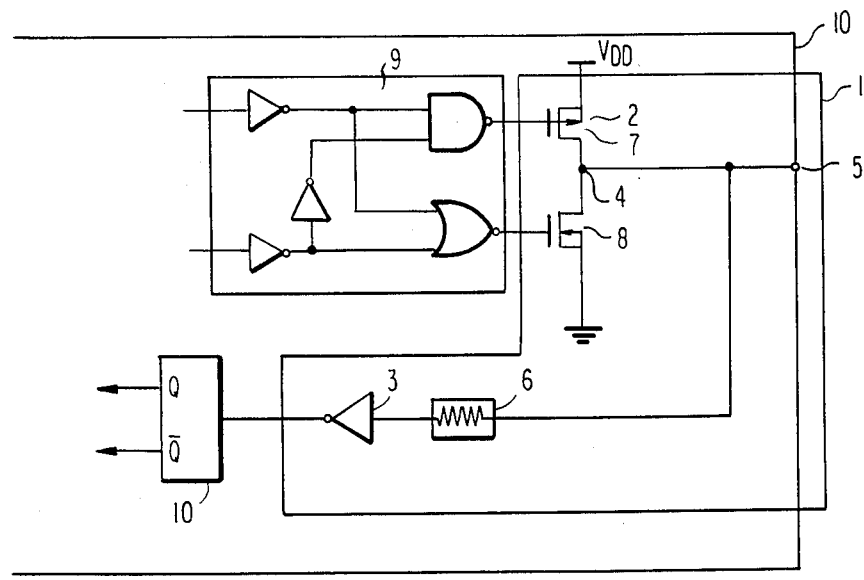
FIG. 1 shows an input and output circuit diagram having CMOS buffer element.

An input and output circuit using CMOS is technology generally designed, as shown in FIG. 1. An input/output block 1 has an output buffer 2 and an input buffer 3. An output end 4 of the output buffer 2 is connected to a bonding pad 5, while an input end of the input buffer 3 is connected to the bonding pad 5 via an input protect circuit 6 having a resistor and/or a diode. The output buffer 2 is constructed with a CMOS transistor, that is a P-channel MOS transistor 7 and an N-channel MOS transistor 8. The output buffer 2 is driven by a drive circuit 9 and derives an output signal in response to outputs of an NAND gate and an NOR gate, while the input buffer 3 applies an input signal transferred through the bonding pad 5 to a latch circuit 10. These elements are integrated in a semiconductor chip 11. The bonding pad 5 is connected to an external lead of the device including the chip by using a bonding wire (not shown).

In this circuit, when the P-channel FET 7 and the N-channel FET 8 are turned off, the output end 4 of the output buffer 2 is electrically uncoupled to the bonding pad 5. At this time the bonding pad 5 is used for receiving an input signal.

Figure 2:
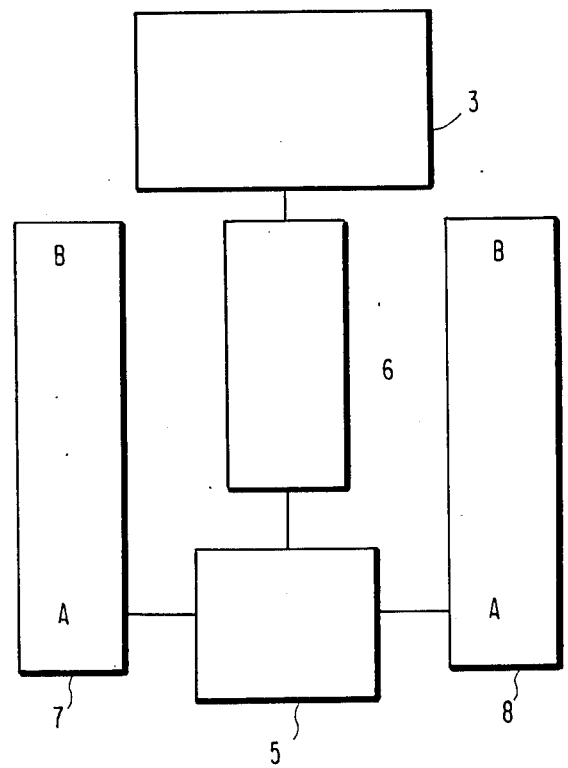
FIG. 2 is an diagram showing an input and output buffer element arranged on a semiconductor chip.

In the prior art, the input/output block 1 is arranged on the chip as shown in FIG. 2. This figure indicates a mask pattern layout of the block 1. The bonding pad 5 and the input protect circuit 6 are located between the P-channel FET 7 and the N-channel FET 8. The bonding pad 5 and one end portion A of the respective FETS 7 and 8 are formed at a peripheral portion of the chip 1. An input buffer 3 is formed inwardly from the bonding pad 5 on the chip 1.

Figure 3:
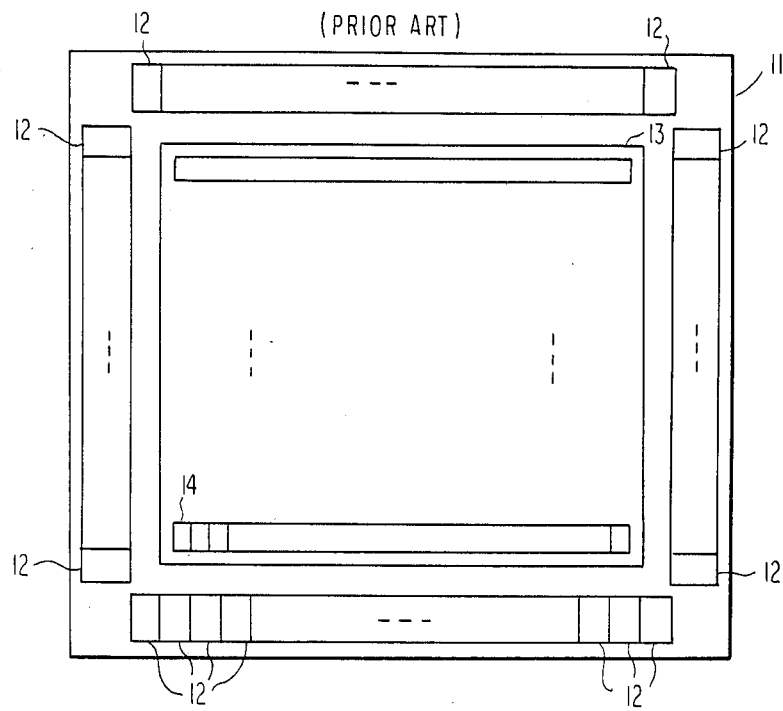
FIG. 3 is a diagram showing a layout pattern on a semiconductor chip used in a gate array device.

Particularly, in a gate array chip of a CMOS IC, a plurality of input/output blocks are formed along peripheral sides of a chip. FIG. 3 shows a layout pattern of the gate array chip 11. Input/output blocks 12 are arranged along the four sides of the chip 11. An internal cell array 13 having a large number of cells 14 is formed at a central portion of the chip. Each input/output block 12 is formed as shown in FIG. 2.

Figure 4:
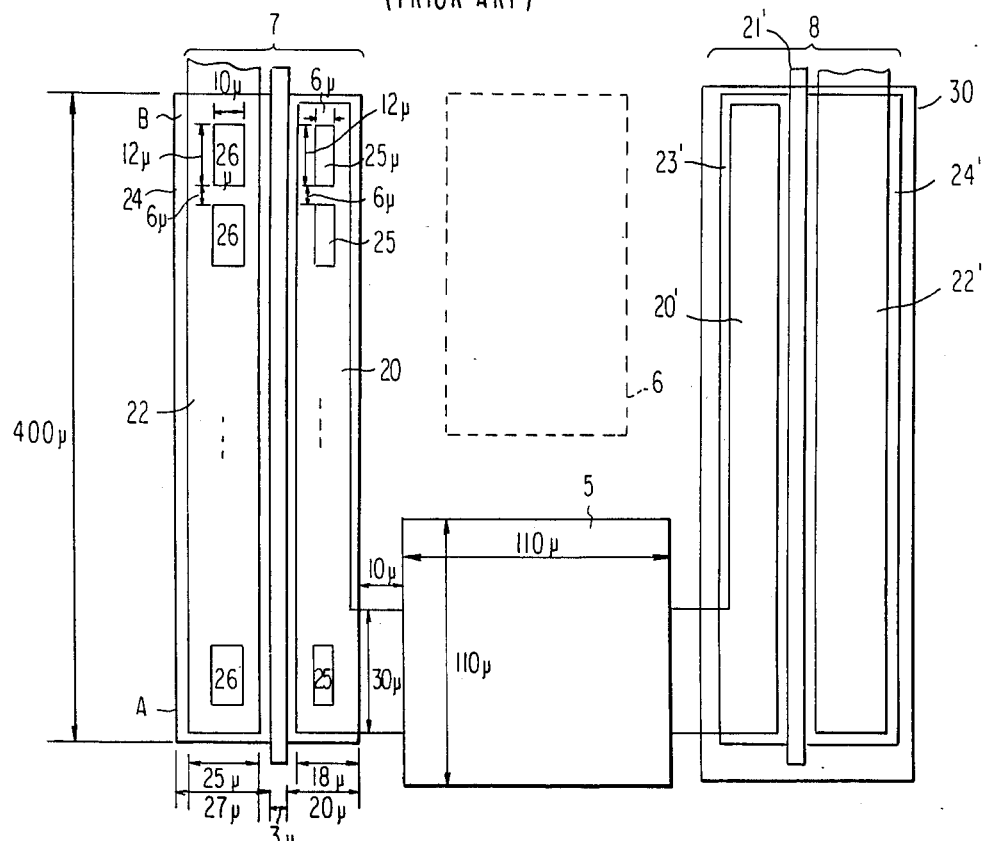
FIG. 4 is a plan view of an output buffer circuit of the prior art.

FIG. 4 shows a detailed pattern in a plan view of the input/output block. The P-channel FET 7 of the output buffer is located on the left side of the bonding pad 5, while the N-channel FET 8 in a P-well region 30 is located on the right side of the pad 5. Of course, the position of FETS 7 and 8 may be reversed. Drain electrodes (i.e. aluminum) 20 and 20' are connected to the bonding pad 5 and are elongated in parallel with the bonding pad 5. The drain electrode 20 is attached to the drain diffusion layer 23 at a plurality of contact areas 25. The source electrode 22 is also attached to the source diffusion layer 24 at a plurality of contact areas 26.

With a voltage source where ($V_{DD}$) is 5 (V) (an absolute rating: MA 7 V), a drive current of drain of 10 (mA) is required. While, a source drive current is 10 (mA), the source region is commonly used, in an adjacent transistor. Therefore, 20 (mA) is required for the source drive current. To satisfy this requirement, sizes of the drain and source diffusion layers 23 and 24 are 18 (mm)×400 (mm) and 27 (mm)×400 (mm), respectively. Sizes of the drain and source electrodes 20 and 22 are 18 (mm)×390 (mm) and 25 (mm)×390 (mm), respectively. Contact area sizes of a source and a drain are 6 (mm)×12 (mm) and 10 (mm)×12 (mm), respectively.

On the other hand, about 10 (mm) is required for the distance between the drain diffusion layer 23 and the bonding pad 5 in order to avoid an influence of a bonding stress, when the size of the bonding pad 5 is 110 (mm)×110 (mm).

In the prior art, the source electrode 22 and the drain electrode 20 are elongated in parallel with the bonding pad 5 as shown in FIG. 4 and have the same width from the one end portion A to the other portion B; wherein the drain electrode width is 18 (mm), and the source electrode width is 25 (mm). Therefore, 60 (mm) is needed for the distance between the bonding pad 5 and the source diffusion layer 24. Thus, a pitch of one output buffer of CMOS transistor is 230 (mm).

Figure 5:
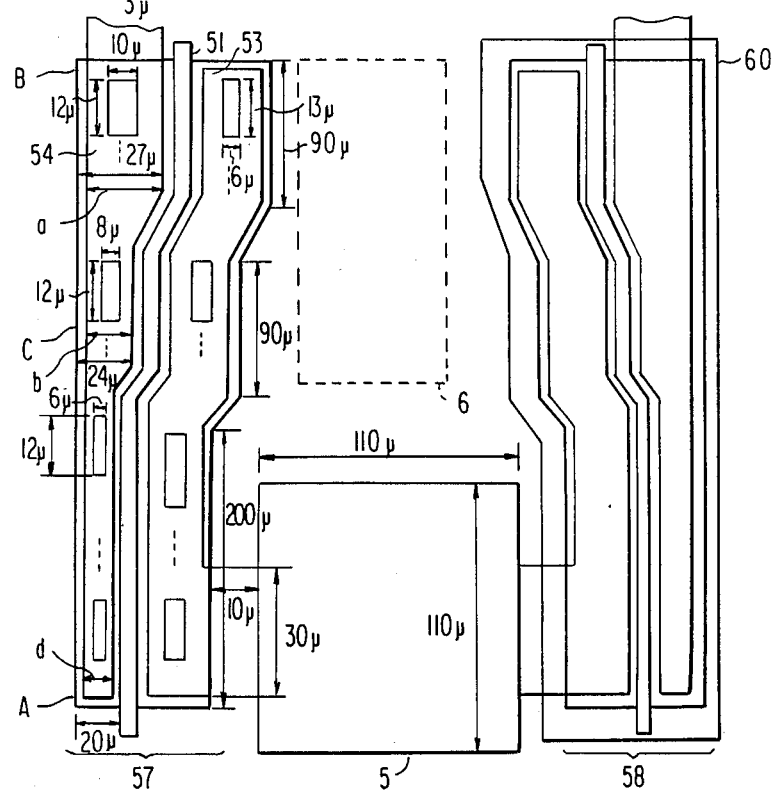
FIG. 5 is a plan view of an output buffer circuit which is an embodiment of the present invention.

FIG. 5 shows an embodiment of the present invention in which a P-channel FET 57 in an N type substrate and an N-channel FET 58 in a P-well region 60 are formed in the shape of tiers, respectively. The drain and the gate are formed in the shape of tiers according to the source, however, the width is not varied. The respective width of the gate and drain electrodes 51 and 53 and the respective width of the channel and the drain diffusion layer are the same size as that of FIG. 4. The width of the source is changed in tiers; a(25 mm) b(22 mm) c(18 mm). Sizes of contact areas are also changed from 10 (mm)×12 (mm) to 6 (mm)×12 (mm). One end portion A does not contribute to the source drive capacity, so the size of it can be reduced. Each size of the source diffusion layer and the source electrode of this portion A may be small, but are required to the contact area. While, in the other end portion B, the same size as FIG. 4 is required. Since a middle portion C relatively effects the source current, the size of it is to be larger than the size of portion A but may be smaller than the size of portion B.

According for FIG. 5, 53 (mm) are required to the distance between the bonding pad 5 and the source diffusion layer. Therefore, a pitch of a CMOS output buffer is 213 (mm). That is, 17 (mm) per one output buffer can be reduced in contrast to the prior art. If a chip size is 4800 (mm)×4800 (mm), 88 bonding pads can be formed on the chip in the present invention. However, only 80 bonding pads are formed on the chip.

Figure 6:
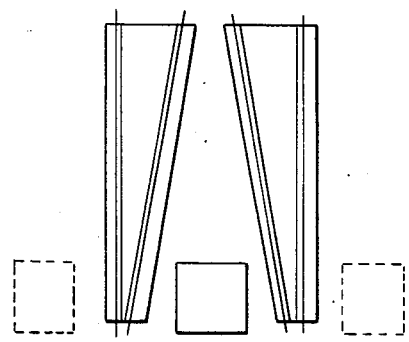
FIGS. 6 and 7 are plan views of an output buffer circuit which are other embodiments of the present invention, respectively.
Figure 7:
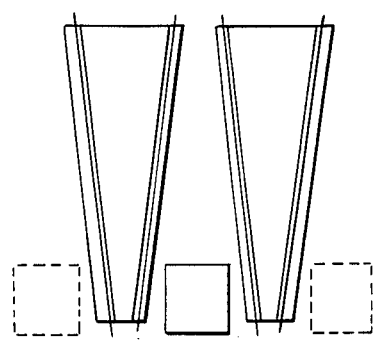

A shape of an output buffer of the present invention may be changed as shown in FIGS. 6 and 7 in which a source region is commonly used by adjacent two bonding pads shown in dotted line. The present invention can be used not only as an input and output buffer but also an output exclusive buffer.

What is claimed is:

1. A semiconductor device comprising an output buffer element having an MOS transistor and a bonding pad on a semiconductor chip, said MOS transistor having a source region, a gate electrode and a drain region, said source region having a first end portion, an intermediate portion narrower than said first end portion and a second end portion narrower than said intermediate portion, said second end portion being adjacent to said bonding pad and near a peripheral side of said semiconductor chip, said first end portion being positioned far from said peripheral side of said semiconductor chip, and said gate electrode and said drain region being elongated along and in parallel with said source region.

2. A semiconductor device comprising two output buffer transistors and a bonding pad, each of said two output buffer transistors being formed in a tapered or tiered shape pattern in a plan view and being elongated on a semiconductor chip, said bonding pad being located between said two output buffer transistors and being positioned near one end portion of said two output buffer transistors, said one end portion having a width smaller than that of the other end portion.

3. In a semiconductor output buffer device having a MOS transistor and a bonding pad on a semiconductor chip, said MOS transistor having a source region, a gate electrode and a drain region, the improvement comprising:

an elongated source region having a first end portion and a second end portion narrower than said first end portion, said second end portion being positioned proximate to said bonding pad and said first end portion being positioned inwardly on said chip from said bonding pad, said gate electrode and said drain region being elongated and disposed in parallel with an edge of said source region.

4. The device of claim 3 wherein said elongated source region is configured in a tiered shape.

5. The device of claim 3 wherein said elongated source region is configured in a tapered shape.

6. The device of claim 3 wherein said second end portion of said source region is positioned proximate to a peripheral edge of said chip.

7. The device of claim 1 further comprising an intermediate portion of said source region disposed between said first end portion and said second end.

8. A semiconductor device comprising an output buffer element including an MOS transistor and a bonding pad on a semiconductor chip, said MOS transistor having a source region, a gate electrode and a drain region, said source region having first and second end portions, said second end portion disposed near said bonding pad near a side of said chip, said first end portion being disposed inwardly from said side, and said second end portion being narrower than said first end portion.

9. The device of claim 1 wherein said source region has a tiered edge on a side proximate to said bonding pad extending from said first end to said second end and has a straight edge on an opposite side from said tiered edge.

10. The device of claim 1 where said source region has an angularly tapered edge extending from said first end to said second end with respect to said side of said chip and is normal with respect to said side of said chip on an opposite side of said source region from said anularly tapered edge.

* * * * *

UNITED STATES PATENT AND TRADEMARK OFFICE
CERTIFICATE OF CORRECTION

PATENT NO. : 4,631,571
DATED : December 23, 1986
INVENTOR(S) : Fusao TSUBOKURA

It is certified that error appears in the above-identified patent and that said Letters Patent is hereby corrected as shown below:

Column 2, line 39, Delete "20 mm x 400 mm" and insert --20 µm x 400 µm--;

Column 2, line 44, Delete "27 mm x 400 mm" insert --27 µm x 400 µm--;

Column 2, line 48, Delete "10 mm" insert --10 µm--

Column 2, line 53, Delete "18 mm x 400 mm" and insert --18 µm x 400 µm--;

Column 2, line 54, Delete "25 mm x 400 mm" and insert --25 µm x 400 µm--;

Column 2, line 56, Delete "60 mm" and insert --60µm--;

Column 3, line 53, Delete "using CMOS is technology" and insert --using CMOS technology is--

Column 4, lines 44, 46, 48, 49, 53, 58, 59, 62 in all occurrences of "mm" delete "mm" and insert --µm--;

Column 5, lines 4, 5, 6, 16, 19, 21, in all occurrences of "mm" delete "mm" and insert --µm--.

Signed and Sealed this

Fifteenth Day of September, 1987

Attest:

DONALD J. QUIGG

*Attesting Officer*     *Commissioner of Patents and Trademarks*